United States Patent
Palmer

(10) Patent No.: US 7,508,665 B1
(45) Date of Patent: Mar. 24, 2009

(54) SERVER FARM LIQUID THERMAL MANAGEMENT SYSTEM

(75) Inventor: Randall T. Palmer, Liberty Lake, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 232 days.

(21) Appl. No.: 11/550,790

(22) Filed: Oct. 18, 2006

(51) Int. Cl.
H05K 7/20 (2006.01)

(52) U.S. Cl. ....................................... 361/696

(58) Field of Classification Search ................. 361/696
See application file for complete search history.

(56) References Cited

U.S. PATENT DOCUMENTS

| | | | |
|---|---|---|---|
| 4,698,728 A * | 10/1987 | Tustaniwskyj et al. | 361/699 |
| 4,721,996 A * | 1/1988 | Tustaniwskyj et al. | 257/713 |
| 5,226,471 A * | 7/1993 | Stefani | 165/200 |
| 5,293,754 A * | 3/1994 | Mizuno | 62/185 |
| 5,522,452 A * | 6/1996 | Mizuno et al. | 165/286 |
| 5,731,954 A * | 3/1998 | Cheon | 361/699 |
| 6,234,240 B1 * | 5/2001 | Cheon | 165/80.3 |
| 6,996,996 B1 * | 2/2006 | Cader | 62/118 |
| 7,012,807 B2 * | 3/2006 | Chu et al. | 361/699 |
| 7,013,662 B1 * | 3/2006 | Tilton et al. | 62/259.2 |
| 7,043,933 B1 * | 5/2006 | Knight | 62/259.2 |
| 7,159,414 B2 * | 1/2007 | Tilton et al. | 62/304 |
| 7,270,174 B2 * | 9/2007 | Chu et al. | 165/11.1 |
| 7,308,801 B1 * | 12/2007 | Tilton et al. | 62/171 |
| 7,401,471 B1 * | 7/2008 | Tilton | 62/171 |
| 2003/0147214 A1 * | 8/2003 | Patel et al. | 361/699 |
| 2004/0040328 A1 * | 3/2004 | Patel et al. | 62/259.2 |
| 2005/0122685 A1 * | 6/2005 | Chu et al. | 361/699 |
| 2005/0126747 A1 * | 6/2005 | Chu et al. | 165/11.1 |
| 2005/0168948 A1 * | 8/2005 | Cader et al. | 361/699 |
| 2007/0193721 A1 * | 8/2007 | Tilton et al. | 165/104.19 |
| 2008/0066889 A1 * | 3/2008 | Knight et al. | 165/104.21 |

* cited by examiner

Primary Examiner—Anatoly Vortman
(74) Attorney, Agent, or Firm—Michael S. Neustel

(57) ABSTRACT

A server farm liquid thermal management system that is efficiently maintained. The server farm liquid thermal management system generally includes a coolant reservoir fluidly connected to a plurality of thermal management units. A supply line from the coolant reservoir is fluidly connected to the thermal management units with a plurality of fill valves positioned within the supply line to selectively control flow to the thermal management units. A return line is fluidly connected to the thermal management units with a plurality of drain valves positioned within the return line to selectively control the draining of the thermal management units. A control unit monitors the coolant levels within each of the thermal management units thereby supplying or removing liquid coolant within each to maintain a desired coolant level.

40 Claims, 6 Drawing Sheets

SERVER FARM LIQUID THERMAL MANAGEMENT SYSTEM

DESCRIPTION OF THE RELATED ART

Any discussion of the prior art throughout the specification should in no way be considered as an admission that such prior art is widely known or forms part of common general knowledge in the field.

A server farm within a data center is comprised of a large number of computer servers (e.g. 100, 1,000, 5,000, 10,000) used by a company to perform various functions (e.g. web hosting, cluster computing). Performance in larger server farms is typically limited by the performance of the data center's cooling systems rather than by the performance of the computer servers. The critical design parameter for server farms commonly is the performance per watt of generated heat instead of performance per processor.

Increased thermal efficiency for a server farm reduces the required size of the data center because of the reduced number of computer servers required. It is becoming increasingly important to reduce the size of data centers while maintaining the same level performance. Conventional air thermal management systems have significant limitations in managing a large server farm. Hence, liquid thermal management systems are becoming the desired choice to thermally manage the computer servers within a server farm.

Single-phase liquid thermal management systems (e.g. liquid cold plates) and multi-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board.

While liquid thermal management systems are highly efficient in removing heat from server farms in a data center, they also require constant monitoring to ensure that liquid coolant levels are maintained at acceptable levels. Monitoring and filling each thermal management unit corresponding to one or more computer servers is time consuming and labor intensive. Each thermal management unit must be individually monitored by an individual and manually filled when the coolant level falls below a threshold level because of leaks, permeation and the like. Hence, there is a need for a server farm liquid thermal management system that is efficiently maintained.

BRIEF SUMMARY OF THE INVENTION

The general purpose of the present invention is to provide a server farm liquid thermal management system that has many of the advantages of the server farm thermal management systems mentioned heretofore. The invention generally relates to a server farm thermal management system which includes a coolant reservoir fluidly connected to a plurality of thermal management units. A supply line from the coolant reservoir is fluidly connected to the thermal management units with a plurality of fill valves positioned within the supply line to selectively control flow to the thermal management units. A return line is fluidly connected to the thermal management units with a plurality of drain valves positioned within the return line to selectively control the draining of the thermal management units. A control unit monitors the coolant levels within each of the thermal management units thereby supplying or removing liquid coolant within each to maintain a desired coolant level.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a server farm liquid thermal management system that is efficiently maintained.

Another object is to provide a server farm liquid thermal management system that reduces the amount time and labor required to monitor and maintain liquid coolant levels.

Another object is to provide a server farm liquid thermal management system that facilitates filling an entire data center populated with newly installed liquid cooled servers.

An additional object is to provide a server farm liquid thermal management system that efficiently dissipates conducted heat within the coolant.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
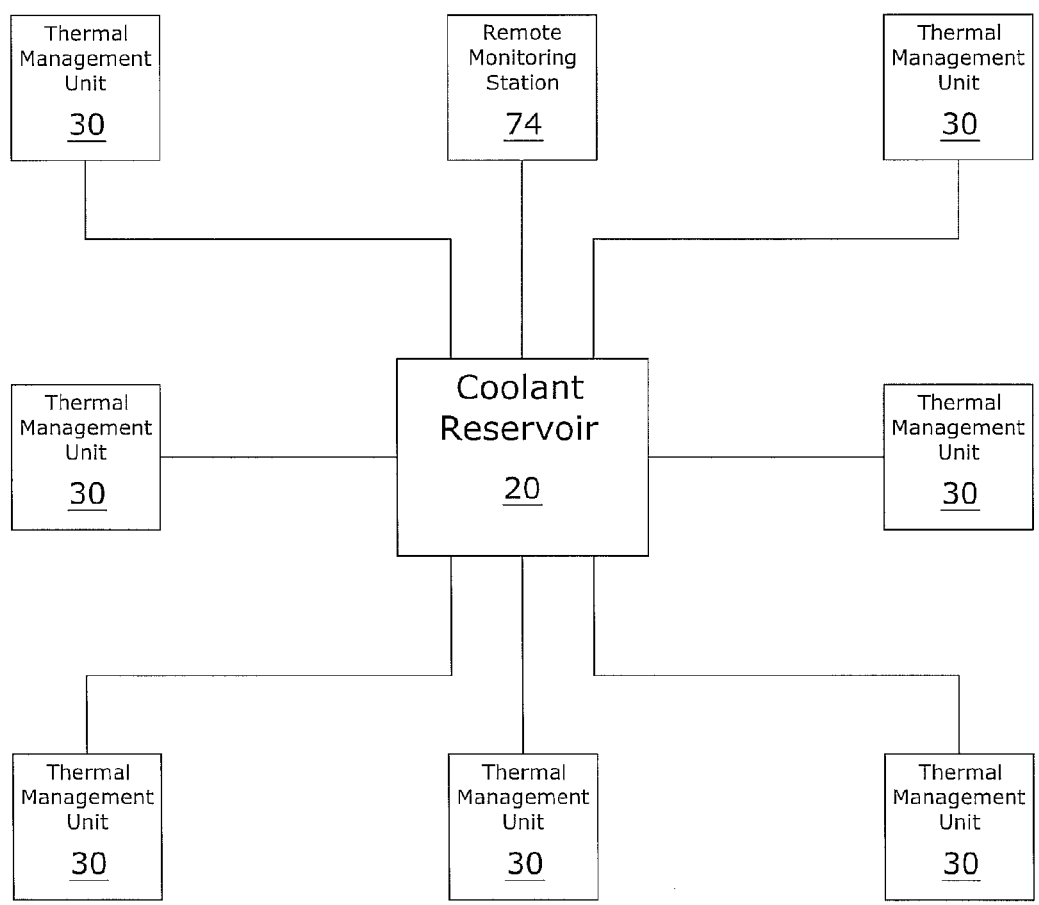
FIG. 1 is a block diagram of the present invention illustrating the fluid connections between the coolant reservoir and the thermal management units.

Turning now descriptively to the drawings, in which similar reference characters denote similar elements throughout the several views, FIGS. 1 through 6 illustrate a server farm liquid thermal management system 10, which comprises a coolant reservoir 20 fluidly connected to a plurality of thermal management units 30. A supply line 40 from the coolant reservoir 20 is fluidly connected to the thermal management units 30 with a plurality of fill valves positioned within the supply line 40 to selectively control flow to the thermal management units 30. A return line 50 is fluidly connected to the thermal management units 30 with a plurality of drain valves positioned within the return line 50 to selectively control the draining of the thermal management units 30. A control unit 24 monitors the coolant levels within each of the thermal management units 30 thereby supplying or removing liquid coolant within each to maintain a desired coolant level.

B. Coolant Reservoir

Figure 2:
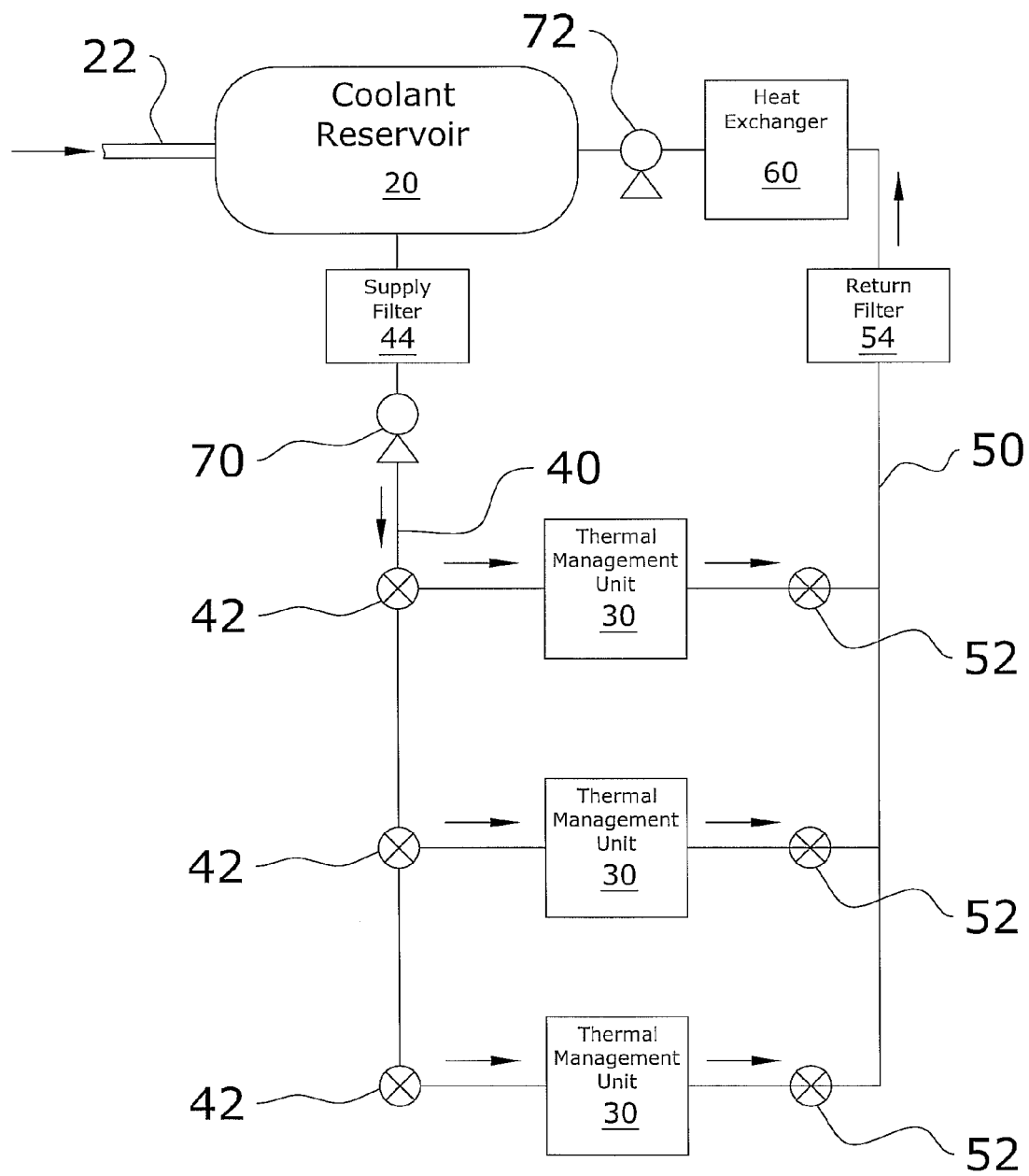
FIG. 2 is a block diagram of one embodiment of the present invention.

FIGS. 1 and 2 illustrate a block diagram of a coolant reservoir 20. The coolant reservoir 20 is designed to store a volume of liquid coolant. The coolant reservoir 20 is also preferably capable of storing a volume of vaporized coolant which may then be condensed within the coolant reservoir 20.

The coolant reservoir 20 may be comprised of any structure (e.g. tank) capable of storing a volume of liquid coolant. The coolant reservoir 20 may be comprised of any size and configuration capable of storing a volume of liquid coolant. The liquid coolant may be comprised of various types of coolants including but not limited to Fluorinet (a trademark of the 3M Corporation) water, alcohol, Dow Corning's OS-10, an azeotrope such as Dow Corning's OS-120, and the like.

The coolant reservoir 20 is preferably positioned centrally within a server farm. However, the coolant reservoir 20 may be positioned away from the server farm. In addition, the coolant reservoir 20 may be positioned externally from the data center.

The coolant reservoir 20 may be sized to store various volumes of liquid coolant. However, the coolant reservoir 20 is preferably capable of storing a significant volume of the liquid coolant to maintain a large number of thermal management units 30 active over long periods of time without intermediate maintenance. It is preferable to have the coolant reservoir 20 sized to approximately 105% to 115% of the total coolant requirements for all of the thermal management units. The extra 5% to 15% of the total coolant requirements is for compensating for permeation, leakage, spillage, loss during servicing and etc. For example, if each thermal management unit 30 requires 2 gallons of coolant and there are 500 thermal management units 30 in a data center, it is preferable that the coolant reservoir 20 is sized to store approximately 1,050 gallons to 1,150 gallons of coolant.

As shown in FIG. 2 of the drawings, a fill line 22 is fluidly connected to the coolant reservoir 20. The fill line 22 is comprised of any liquid transfer line that allows the transfer of liquid coolant from a filling device to the coolant reservoir 20. The filling device may be comprised of any device capable of transporting the liquid coolant to the coolant reservoir 20.

The coolant reservoir 20 is may also be used to thermally condition the waste liquid coolant from the thermal management units 30. The coolant reservoir 20 may thermally condition the waste liquid coolant through simple conduction through a tank wall or a heat exchanger 60 may be thermally connected to the coolant reservoir 20 to increase the thermal management capability of the system.

As shown in FIG. 1 of the drawings, it is preferable to have a remote monitoring station in communication with the coolant reservoir 20 to monitor coolant characteristics within the coolant reservoir 20 such as but not limited to coolant level and coolant temperature. The remote monitoring station may be in communication with the coolant reservoir 20 and the control unit 24 via various wireless and wired communication technologies.

C. Thermal Management Units

FIGS. 1 and 2 illustrate the thermal management units 30 in fluid communication with the coolant reservoir 20. Each of the thermal management units 30 is designed to thermally manage at least one electronic device 12 such as but not limited to computer server in a server farm.

The thermal management units 30 are comprised of a single phase or multi-phase liquid thermal management system such as but not limited to spray cooling or cold plates. An exemplary spray cooling system is illustrated in U.S. Pat. No. 6,104,610 and is hereby incorporated by reference into this application.

The plurality of thermal management units 30 are preferably comprised of a one to one ratio of thermal management units 30 to computer servers in a server farm. It can be appreciated that a smaller or larger ratio of thermal management units 30 may be utilized in the present invention to accommodate various sizes of server farms.

D. Supply System

As shown in FIG. 2 of the drawings, a supply line 40 is fluidly connected to the coolant reservoir 20 to deliver the liquid coolant to the thermal management units 30. A supply pump 70 is preferably fluidly connected to the supply line 40 to draw the liquid coolant from the coolant reservoir 20 and to provide pressurized liquid coolant to the plurality of thermal management units 30 as further shown in FIG. 2 of the drawings. The supply pump 70 may be comprised of any commonly utilized pressure pump device. Alternatively, the supply pump 70 may be comprised of the coolant reservoir 20 elevated above the thermal management units 30 to provide the pressurized liquid coolant via a gravity feed. A supply filter 44 may be fluidly positioned within the supply line 40 to filter the supply liquid coolant.

As further shown in FIG. 2 of the drawings, a plurality of supply valves 42 are fluidly connected to the supply line 40 after the supply pump 70. The supply valves 42 are further fluidly connected to the thermal management units 30 to selectively supply the liquid coolant to one or more of the thermal management units 30. While the drawings illustrate the supply valves 42 being fluidly positioned within the supply line 40, it can be appreciated that the supply valves 42 may also be positioned within the branch lines feeding each of the thermal management units 30.

Each of the supply valves 42 is in communication with and activated by the control unit 24 in a preferably automated manner. It can be appreciated that the supply valves 42 may be directly activated by the remote monitoring station in various situations.

One or more of the supply valves 42 are opened when the coolant level within one or more of the thermal management units 30 is below a minimum level as preferably determined by the level sensors 32. The minimum level is preferably comprised of a predetermined approximate level that prevents damage to the thermal management unit 30 and the electronic device 12 being thermally managed.

One or more of the supply valves 42 are closed when the coolant level within the plurality of thermal management units 30 is at a desired level as preferably determined by the level sensors 32. The desired level may be approximately equal to the minimum level or it may be approximately greater than the minimum level (e.g. a range of levels).

E. Return System

As shown in FIG. 2 of the drawings, a return line 50 is preferably fluidly connected to the plurality of thermal management units 30. The return line 50 is further fluidly connected to the coolant reservoir 20 to return the waste liquid coolant from the thermal management units 30 to the coolant reservoir 20. The waste liquid coolant may be comprised of heated liquid coolant and/or vaporized coolant. The main purpose for the return line 50 is to allow a thermal management unit 30 to be drained for any number of reasons including but not limited to maintenance of the thermal management unit 30 and cycling new, clean, or conditioned (e.g. thermally, degassed, filtered, etc.) liquid coolant to the thermal management unit 30, etc. A return filter 54 may be fluidly positioned within the return line 50 to filter the waste liquid coolant.

A return pump 72 is preferably fluidly connected to the return line 50 to draw the waste liquid coolant from the thermal management units 30 and to return the liquid coolant to the coolant reservoir 20. The return pump 72 may be comprised of any commonly utilized pressure pump device similar to the supply pump 70. Alternatively, the return pump 72 may be comprised of the coolant reservoir 20 positioned below the thermal management units 30 to receive the waste liquid coolant via a gravity feed. The expansion of the coolant vapor may also force the waste liquid coolant to the coolant reservoir 20.

As shown in FIG. 2 of the drawings, a plurality of return valves 52 are fluidly connected to the return line 50 to manage the return of the waste liquid coolant from the thermal management units 30. The return valves 52 are fluidly connected to the plurality of thermal management units 30 to selectively receive the liquid coolant from the plurality of thermal management units 30. The return valves 52 are illustrated in FIG. 2 as being positioned within a branch line extending from the thermal management units 30, however the return valves 52 may be directly connected within the return line 50 also.

The plurality of return valves 52 are selectively opened when the coolant level within the plurality of thermal management units 30 exceeds a maximum level to prevent overfilling of the thermal management units 30. The opening of the return valves 52 allows for the waste coolant within the thermal management units 30 to pass through and to the coolant reservoir 20. The return valves 52 are preferably closed when the coolant level within the plurality of thermal management units 30 is at the desired level as determined by the level sensors 32.

While the coolant reservoir 20 may directly thermally condition the waste coolant from the thermal management units 30, a heat exchanger 60 is preferably fluidly connected to the return line 50 to thermally condition the liquid coolant within the return line 50 prior to returning the coolant to the coolant reservoir 20. The heat exchanger 60 may be comprised of any conventional heat transfer technology suitable for usage in single phase or multi-phase liquid thermal management systems.

Figure 5:
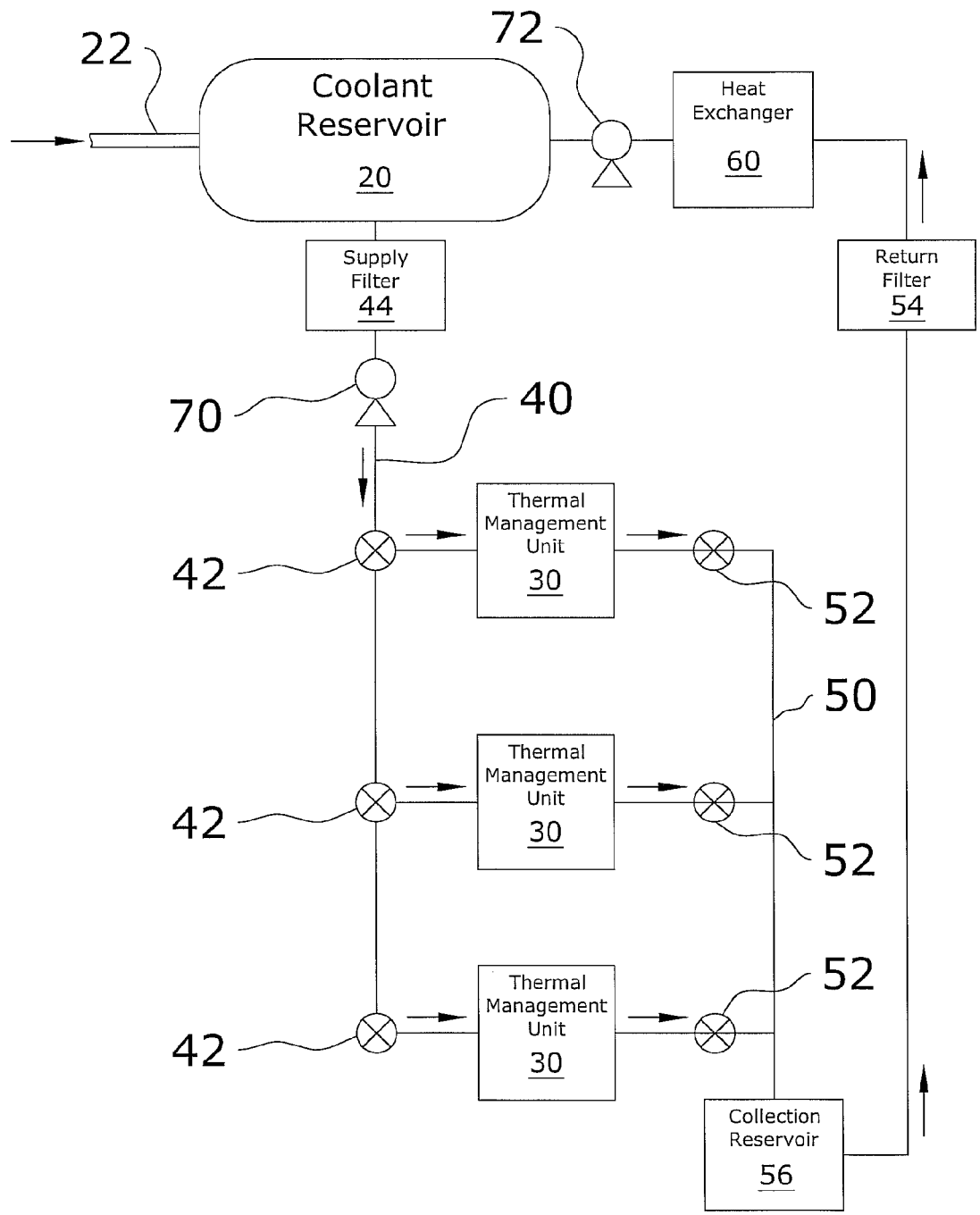
FIG. 5 is a block diagram of an alternative embodiment of the present invention utilizing a collection reservoir positioned below the thermal management units.

FIG. 5 illustrates an alternative embodiment where a collection reservoir 56 is positioned below the thermal management units 30 to receive the waste coolant via gravity feed. The collection reservoir 56 is fluidly connected to the return pump 72 which may pump the waste coolant back to the coolant reservoir 20 at low power over a long period of time.

Figure 6:
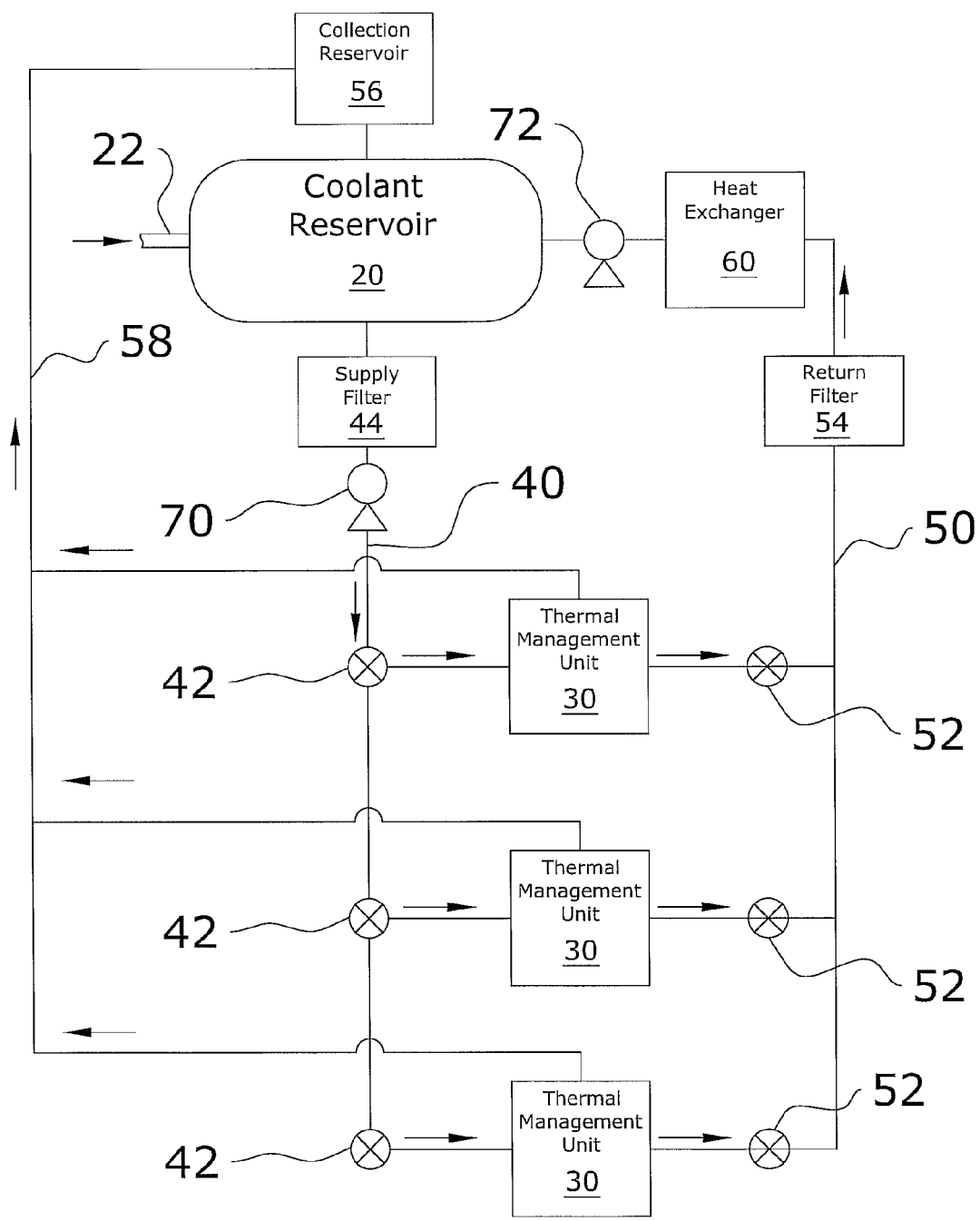
FIG. 6 is a block diagram of a second alternative embodiment of the present invention with the collection reservoir positioned above the coolant reservoir.

In another alternative embodiment shown in FIG. 6, the collection reservoir 56 is positioned above the coolant reservoir and is fluidly connected to the coolant reservoir 20. The collection reservoir 56 is also fluidly connected to the thermal management units 30 to receive coolant vapor that wafts to collection reservoir 56. The coolant vapor within the collection reservoir 56 condenses and then drains down into the coolant reservoir 20 via a gravity feed.

F. Control Unit

Figure 3:
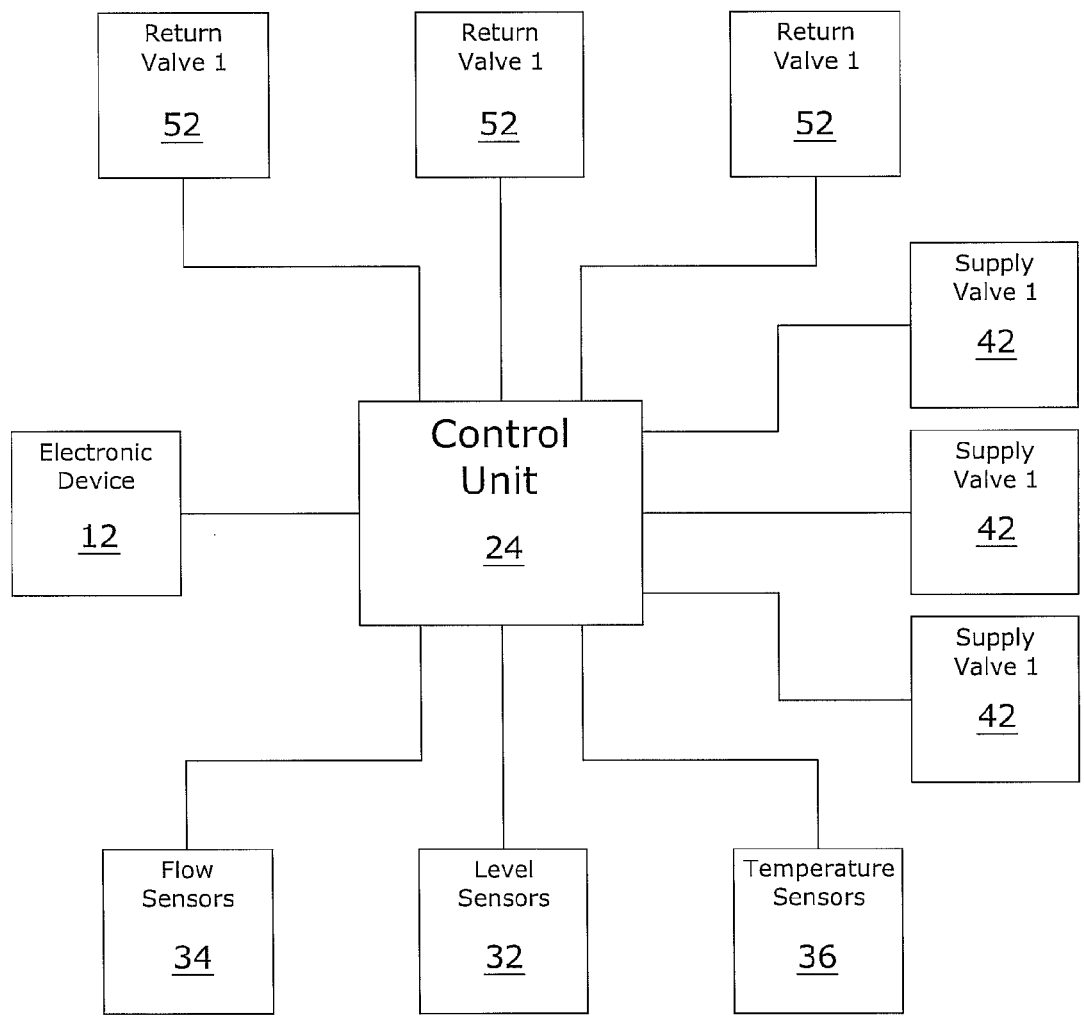
FIG. 3 is a block diagram illustrating the communications between the control unit and various components of the present invention.

The control unit 24 is in communication with the thermal management units 30 and computer servers to determine at least one coolant characteristic (e.g. coolant level, coolant temperature). As shown in FIG. 3 of the drawings, the control unit 24 is also in communication with the level sensors 32, the supply valves 42 and the return valves 52.

The control unit 24 monitors the coolant level within each of the thermal management units 30 to determine if liquid coolant needs to be supplied to or removed from the respective thermal management unit 30. The control unit 24 ensures that a desired level of coolant is maintained within each thermal management unit 30 at all times during operation and for all phases of operation including but not limited to a maintenance phase.

In addition, the control unit 24 preferably automatically opens one or more supply valves 42 and one or more of the return valves 52 to circulate the liquid coolant from the thermal management units 30 to the coolant reservoir 20. The circulation of the liquid coolant between the thermal management units 30 and the coolant reservoir 20 serves to increase thermal conditioning of the liquid coolant by removing heat from the coolant in the coolant reservoir 20 (and the heat exchanger 60).

Additionally, liquid coolant may be circulated through a thermal management unit 30 to facilitate preconditioning of newly installed printed circuit assemblies. For example, a supply valve 42 could be opened with the corresponding return valve 52 opened to allow for washing of the newly installed printed circuit assemblies to remove any contaminants and other debris. Alternatively a second liquid may be pumped through a secondary set of lines to wash the newly installed printed circuit assemblies.

G. Sensors

One or more level sensors 32 are connected to each of the thermal management units 30 to determine a coolant level within the thermal management units 30. One or more temperature sensors 36 are thermally connected to each of the thermal management units 30 to monitor a temperature within or outside of the thermal management units 30 (e.g. coolant temperature, electronic device temperature).

One or more flow sensors 34 are fluidly connected between the plurality of supply valves 42 and the plurality of thermal management units 30 to monitor a volume (and flow rate) of coolant flowing to or from each of the thermal management units 30. The flow sensors 34 allow for direct monitoring of the amount of liquid coolant used by each thermal management unit 30. The flow sensor data may be utilized to determine a defective thermal management unit 30 or for billing purposes where the thermal management units 30 are thermally managing electronic devices 12 owned by different clients of the company. A defective (e.g. leaky) thermal management unit 30 may continue to receive additional coolant until such time as the defective thermal management unit 30 can be properly shut down and or service or replaced.

The sensors 32, 34, 36 are all preferably in communication with the control unit 24 directly, however the sensors 32, 34, 36 may be in communication indirectly with the control unit 24. For example, the sensors 32, 34, 36 may communicate directly with the electronic device 12 (e.g. computer server) which then communicates the data to the control unit 24.

H. Operation of One Embodiment

In use, the coolant reservoir 20 is filled with liquid coolant to a level sufficient to provide a backup coolant supply for the server farm. The control unit 24 monitors the coolant characteristics within each of the thermal management units 30 such as coolant level.

Figure 4:
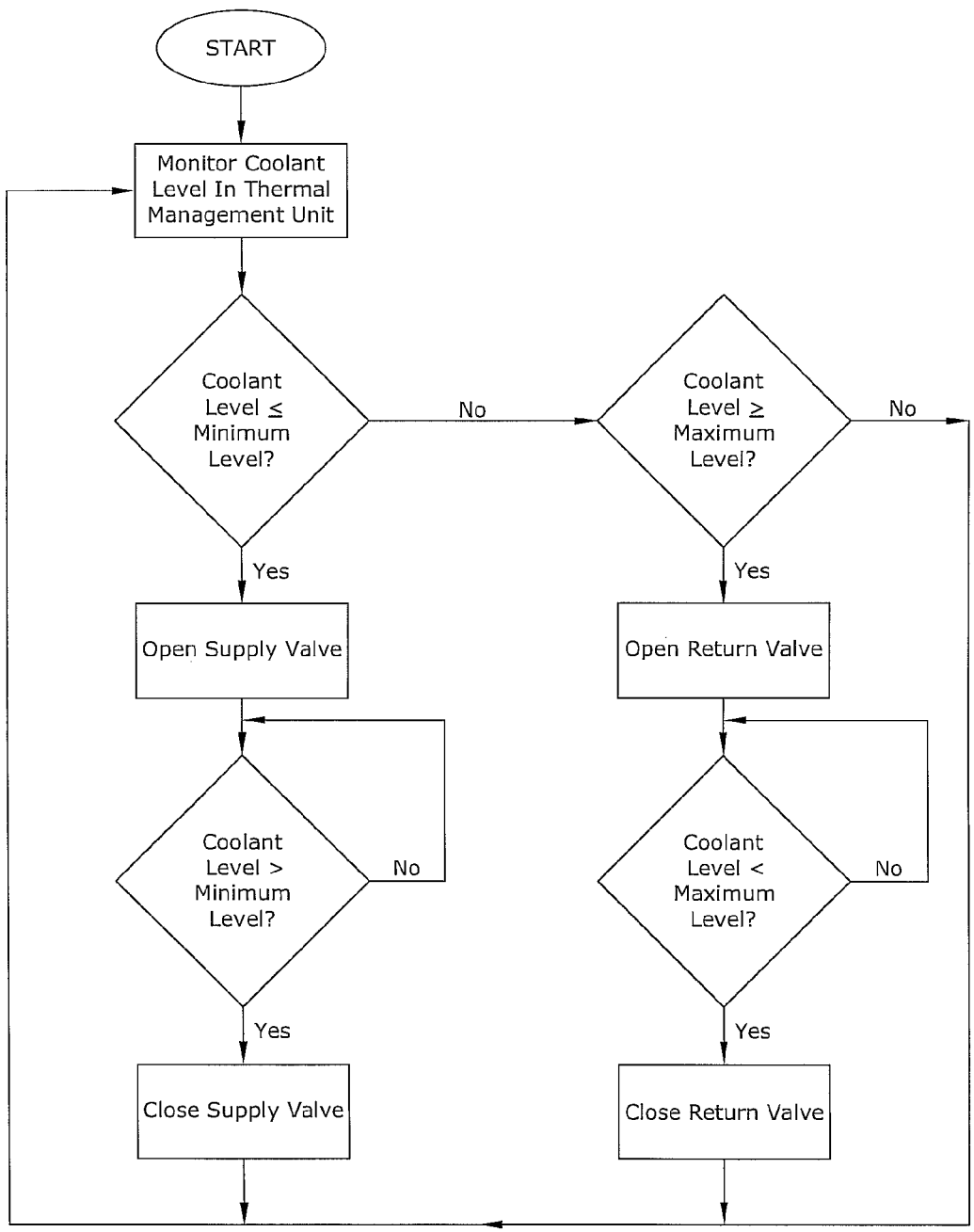
FIG. 4 is a flowchart illustrating the overall operation of the present invention.

If the coolant level within a first thermal management unit 30 is below the minimum level, the control unit 24 preferably automatically communicates to the corresponding first supply valve to open and activates the supply pump 70 to provide a supply of liquid coolant to the first thermal management unit 30. The first supply valve remains open until the coolant level within the first thermal management unit 30 is at least above the minimum coolant level and then the first supply valve is closed by the control unit 24 as illustrated in FIG. 4 of the drawings. During the filling of the first thermal management unit 30 a corresponding first flow sensor monitors the volume of liquid coolant added to the first thermal management unit 30 which is communicated to the control unit 24. The supply pump 70 is also deactivated.

If the coolant level within a first thermal management unit 30 is above the maximum level, the control unit 24 preferably automatically communicates to the corresponding first return valve to open and activates the return pump 72 to allow the waste coolant to flow from the first thermal management unit 30 to the coolant reservoir 20. The first return valve remains open until the coolant level within the first thermal management unit 30 is at least below the maximum coolant level and then the first return valve is closed by the control unit 24 as further illustrated in FIG. 4 of the drawings. The return pump 72 is also deactivated.

In addition, the control unit 24 may open both the first supply valve and the first return valve for the first thermal management unit 30 to allow for circulation of the liquid coolant. This may be done to thermally condition the liquid coolant if the coolant temperature is exceeding a desired temperature. This may be done to a selected single or a plurality of thermal management units 30. Also, the circulation of coolant may be done globally through all of the thermal management units 30.

In addition, while it is preferable that the control unit 24 automatically perform the above-stated operations, the remote monitoring station may also communicate commands to the control unit 24 or the devices directly to provide maintenance of the thermal management system.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A server farm liquid thermal management system, comprising:
    a coolant reservoir to store a liquid coolant;
    a plurality of thermal management units to thermally manage a plurality of electronic devices, wherein said thermal management units are comprised of a liquid thermal management system;
    a supply line fluidly connected to said coolant reservoir to deliver said liquid coolant;
    a supply pump fluidly connected to said supply line to draw said liquid coolant from said coolant reservoir and to provide pressurized liquid coolant to said plurality of thermal management units;
    a plurality of level sensors connected to said plurality of thermal management units to determine a coolant level within said plurality of thermal management units;
    a plurality of supply valves fluidly connected to said supply line, wherein said plurality of supply valves are fluidly connected to said plurality of thermal management units to selectively supply said liquid coolant to said plurality of thermal management units; and
    a plurality of flow sensors fluidly connected between said plurality of supply valves and said plurality of thermal management units to monitor a volume of coolant flowing to said plurality of thermal management units.

2. The server farm liquid thermal management system of claim 1, including a control unit in communication with said plurality of level sensors and said plurality of supply valves, wherein said control unit controls a state of said plurality of supply valves.

3. The server farm liquid thermal management system of claim 1, including a fill line fluidly connected to said coolant reservoir to fill said coolant reservoir with said liquid coolant.

4. The server farm liquid thermal management system of claim 1, including a remote monitoring station in communication with said coolant reservoir to monitor a coolant characteristic within said coolant reservoir.

5. The server farm liquid thermal management system of claim 1, including a return line fluidly connected to said plurality of thermal management units and said coolant reservoir to return said liquid coolant from said plurality of thermal management units to said coolant reservoir.

6. The server farm liquid thermal management system of claim 5, including a heat exchanger fluidly connected to said return line to thermally condition said liquid coolant within said return line.

7. The server farm liquid thermal management system of claim 5, including a heat exchanger thermally connected to said coolant reservoir to thermally condition said liquid coolant within said coolant reservoir.

8. The server farm liquid thermal management system of claim 5, including a return pump fluidly connected to said return line.

9. The server farm liquid thermal management system of claim 5, including a plurality of return valves fluidly connected to said return line, wherein said plurality of return valves are fluidly connected to said plurality of thermal management units to selectively receive said liquid coolant from said plurality of thermal management units.

10. The server farm liquid thermal management system of claim 9, wherein said plurality of return valves are selectively opened when said coolant level within said plurality of thermal management units exceeds a maximum level.

11. The server farm liquid thermal management system of claim 10, wherein said plurality of return valves are closed when said coolant level within said plurality of thermal management units is at a desired level.

12. The server farm liquid thermal management system of claim 9, including a control unit in communication with said plurality of supply valves and said plurality of return valves, wherein said control unit monitors said coolant level within each of said thermal management units to supply liquid coolant to or remove liquid coolant from said plurality of thermal management units to maintain a desired coolant level.

13. The server farm liquid thermal management system of claim 9, including a control unit in communication with said plurality of supply valves and said plurality of return valves, wherein said control unit opens said plurality of supply valves and said plurality of return valves to circulate said liquid coolant from said thermal management units to said coolant reservoir to increase thermal conditioning of said liquid coolant.

14. The server farm liquid thermal management system of claim 13, including a plurality of temperature sensors thermally connected to said plurality of thermal management units to monitor a temperature within said plurality of thermal management units.

15. The server farm liquid thermal management system of claim 9, wherein said plurality of supply valves are opened when said coolant level within said plurality of thermal management units is below a minimum level as determined by said plurality of level sensors.

16. The server farm liquid thermal management system of claim 15, wherein said plurality of supply valves are closed when said coolant level within said plurality of thermal management units is at a desired level as determined by said plurality of level sensors.

17. A server farm liquid thermal management system, comprising:
a coolant reservoir to store a liquid coolant;
a plurality of thermal management units to thermally manage a plurality of electronic devices, wherein said thermal management units are comprised of a liquid thermal management system;
a supply line fluidly connected to said coolant reservoir to deliver said liquid coolant;
a supply pump fluidly connected to said supply line to draw said liquid coolant from said coolant reservoir and to provide pressurized liquid coolant to said plurality of thermal management units;
a return line fluidly connected to said plurality of thermal management units and said coolant reservoir to return said liquid coolant from said plurality of thermal management units to said coolant reservoir;
a return pump fluidly connected to said return line to draw said liquid coolant from said plurality of thermal management units and to return said liquid coolant to said coolant reservoir;
a plurality of level sensors connected to said plurality of thermal management units to determine a coolant level within said plurality of thermal management units;
a plurality of supply valves fluidly connected to said supply line, wherein said plurality of supply valves are fluidly connected to said plurality of thermal management units to selectively supply said liquid coolant to said plurality of thermal management units;
a plurality of return valves fluidly connected to said return line, wherein said plurality of return valves are fluidly connected to said plurality of thermal management units to selectively receive said liquid coolant from said plurality of thermal management units; and
a control unit in communication with said plurality of level sensors, said plurality of supply valves and said plurality of return valves, wherein said control unit monitors said coolant level within each of said thermal management units to supply liquid coolant to or remove liquid coolant from said plurality of thermal management units to maintain a desired coolant level.

18. The server farm liquid thermal management system of claim 17, including a fill line fluidly connected to said coolant reservoir to fill said coolant reservoir with said liquid coolant.

19. The server farm liquid thermal management system of claim 17, including a remote monitoring station in communication with said coolant reservoir to monitor a coolant characteristic within said coolant reservoir.

20. The server farm liquid thermal management system of claim 17, including a heat exchanger fluidly connected to said return line to thermally condition said liquid coolant within said return line.

21. The server farm liquid thermal management system of claim 17, including a heat exchanger thermally connected to said coolant reservoir to thermally condition said liquid coolant within said coolant reservoir.

22. The server farm liquid thermal management system of claim 17, wherein said plurality of return valves are selectively opened when said coolant level within said plurality of thermal management units exceeds a maximum level.

23. The server farm liquid thermal management system of claim 22, wherein said plurality of return valves are closed when said coolant level within said plurality of thermal management units are at a desired level as determined by said plurality of level sensors.

24. The server farm liquid thermal management system of claim 17, wherein said control unit opens said plurality of supply valves and said plurality of return valves to circulate said liquid coolant from said thermal management units to said coolant reservoir to increase thermal conditioning of said liquid coolant.

25. The server farm liquid thermal management system of claim 24, including a plurality of temperature sensors thermally connected to said plurality of thermal management units to monitor a temperature within said plurality of thermal management units.

26. The server farm liquid thermal management system of claim 17, wherein said plurality of supply valves are opened when said coolant level within said plurality of thermal management units is below a minimum level as determined by said plurality of level sensors.

27. The server farm liquid thermal management system of claim 26, wherein said plurality of supply valves are closed when said coolant level within said plurality of thermal management units is at a desired level as determined by said plurality of level sensors.

28. The server farm liquid thermal management system of claim 17, including a plurality of flow sensors fluidly connected between said plurality of supply valves and said plurality of thermal management units to monitor a volume of coolant flowing to said plurality of thermal management units.

29. A server farm liquid thermal management system, comprising:
a coolant reservoir to store a liquid coolant;

a fill line fluidly connected to said coolant reservoir to fill said coolant reservoir with said liquid coolant;

a plurality of thermal management units to thermally manage a plurality of electronic devices, wherein said thermal management units are comprised of a liquid thermal management system;

a supply line fluidly connected to said coolant reservoir to deliver said liquid coolant;

a supply pump fluidly connected to said supply line to draw said liquid coolant from said coolant reservoir and to provide pressurized liquid coolant to said plurality of thermal management units;

a return line fluidly connected to said plurality of thermal management units and said coolant reservoir to return said liquid coolant from said plurality of thermal management units to said coolant reservoir;

a return pump fluidly connected to said return line to draw said liquid coolant from said plurality of thermal management units and to return said liquid coolant to said coolant reservoir;

a plurality of level sensors connected to said plurality of thermal management units to determine a coolant level within said plurality of thermal management units;

a plurality of supply valves fluidly connected to said supply line, wherein said plurality of supply valves are fluidly connected to said plurality of thermal management units to selectively supply said liquid coolant to said plurality of thermal management units;

wherein said plurality of supply valves are opened when said coolant level within said plurality of thermal management units is below a minimum level as determined by said plurality of level sensors, and wherein said plurality of supply valves are closed when said coolant level within said plurality of thermal management units is at a desired level as determined by said plurality of level sensors;

a plurality of return valves fluidly connected to said return line, wherein said plurality of return valves are fluidly connected to said plurality of thermal management units to selectively receive said liquid coolant from said plurality of thermal management units;

wherein said plurality of return valves are selectively opened when said coolant level within said plurality of thermal management units exceeds a maximum level and wherein said plurality of return valves are closed when said coolant level within said plurality of thermal management units is at a desired level as determined by said plurality of level sensors; and a control unit in communication with said plurality of level sensors, said plurality of supply valves and said plurality of return valves, wherein said control unit monitors said coolant level within each of said thermal management units to supply liquid coolant to or remove liquid coolant from said plurality of thermal management units to maintain a desired coolant level.

30. The server farm liquid thermal management system of claim 29, including a remote monitoring station in communication with said coolant reservoir to monitor a coolant characteristic within said coolant reservoir.

31. The server farm liquid thermal management system of claim 29, including a heat exchanger fluidly connected to said return line to thermally condition said liquid coolant within said return line.

32. The server farm liquid thermal management system of claim 29, including a heat exchanger thermally connected to said coolant reservoir to thermally condition said liquid coolant within said coolant reservoir.

33. The server farm liquid thermal management system of claim 29, wherein said control unit opens said plurality of supply valves and said plurality of return valves to circulate said liquid coolant from said thermal management units to said coolant reservoir to increase thermal conditioning of said liquid coolant.

34. The server farm liquid thermal management system of claim 33, including a plurality of temperature sensors thermally connected to said plurality of thermal management units to monitor a temperature within said plurality of thermal management units.

35. The server farm liquid thermal management system of claim 33, including a plurality of flow sensors fluidly connected between said plurality of supply valves and said plurality of thermal management units to monitor a volume of coolant flowing to said plurality of thermal management units.

36. A server farm liquid thermal management system, comprising:

a coolant reservoir to store a liquid coolant;

a plurality of thermal management units to thermally manage a plurality of electronic devices, wherein said thermal management units are comprised of a liquid thermal management system;

a supply line fluidly connected to said coolant reservoir to deliver said liquid coolant;

a supply pump fluidly connected to said supply line to draw said liquid coolant from said coolant reservoir and to provide pressurized liquid coolant to said plurality of thermal management units;

a plurality of level sensors connected to said plurality of thermal management units to determine a coolant level within said plurality of thermal management units;

a plurality of supply valves fluidly connected to said supply line, wherein said plurality of supply valves are fluidly connected to said plurality of thermal management units to selectively supply said liquid coolant to said plurality of thermal management units;

a return line fluidly connected to said plurality of thermal management units and said coolant reservoir to return said liquid coolant from said plurality of thermal management units to said coolant reservoir; and a heat exchanger fluidly connected to said return line to thermally condition said liquid coolant within said return line.

37. A server farm liquid thermal management system, comprising:

a coolant reservoir to store a liquid coolant;

a plurality of thermal management units to thermally manage a plurality of electronic devices, wherein said thermal management units are comprised of a liquid thermal management system;

a supply line fluidly connected to said coolant reservoir to deliver said liquid coolant;

a supply pump fluidly connected to said supply line to draw said liquid coolant from said coolant reservoir and to provide pressurized liquid coolant to said plurality of thermal management units;

a plurality of level sensors connected to said plurality of thermal management units to determine a coolant level within said plurality of thermal management units;

a plurality of supply valves fluidly connected to said supply line, wherein said plurality of supply valves are fluidly connected to said plurality of thermal management units to selectively supply said liquid coolant to said plurality of thermal management units;

a return line fluidly connected to said plurality of thermal management units and said coolant reservoir to return said liquid coolant from said plurality of thermal management units to said coolant reservoir; and a heat exchanger thermally connected to said coolant reservoir to thermally condition said liquid coolant within said coolant reservoir.

38. A server farm liquid thermal management system, comprising:

a coolant reservoir to store a liquid coolant;

a plurality of thermal management units to thermally manage a plurality of electronic devices, wherein said thermal management units are comprised of a liquid thermal management system;

a supply line fluidly connected to said coolant reservoir to deliver said liquid coolant;

a supply pump fluidly connected to said supply line to draw said liquid coolant from said coolant reservoir and to provide pressurized liquid coolant to said plurality of thermal management units;

a plurality of level sensors connected to said plurality of thermal management units to determine a coolant level within said plurality of thermal management units;

a plurality of supply valves fluidly connected to said supply line, wherein said plurality of supply valves are fluidly connected to said plurality of thermal management units to selectively supply said liquid coolant to said plurality of thermal management units;

a return line fluidly connected to said plurality of thermal management units and said coolant reservoir to return said liquid coolant from said plurality of thermal management units to said coolant reservoir;

a plurality of return valves fluidly connected to said return line, wherein said plurality of return valves are fluidly connected to said plurality of thermal management units to selectively receive said liquid coolant from said plurality of thermal management units; and a control unit in communication with said plurality of supply valves and said plurality of return valves, wherein said control unit monitors said coolant level within each of said thermal management units to supply liquid coolant to or remove liquid coolant from said plurality of thermal management units to maintain a desired coolant level.

39. A server farm liquid thermal management system, comprising:

a coolant reservoir to store a liquid coolant;

a plurality of thermal management units to thermally manage a plurality of electronic devices, wherein said thermal management units are comprised of a liquid thermal management system;

a supply line fluidly connected to said coolant reservoir to deliver said liquid coolant;

a supply pump fluidly connected to said supply line to draw said liquid coolant from said coolant reservoir and to provide pressurized liquid coolant to said plurality of thermal management units;

a plurality of level sensors connected to said plurality of thermal management units to determine a coolant level within said plurality of thermal management units;

a plurality of supply valves fluidly connected to said supply line, wherein said plurality of supply valves are fluidly connected to said plurality of thermal management units to selectively supply said liquid coolant to said plurality of thermal management units;

a return line fluidly connected to said plurality of thermal management units and said coolant reservoir to return said liquid coolant from said plurality of thermal management units to said coolant reservoir;

a plurality of return valves fluidly connected to said return line, wherein said plurality of return valves are fluidly connected to said plurality of thermal management units to selectively receive said liquid coolant from said plurality of thermal management units; and a control unit in communication with said plurality of supply valves and said plurality of return valves, wherein said control unit opens said plurality of supply valves and said plurality of return valves to circulate said liquid coolant from said thermal management units to said coolant reservoir to increase thermal conditioning of said liquid coolant.

40. The server farm liquid thermal management system of claim 39, including a plurality of temperature sensors thermally connected to said plurality of thermal management units to monitor a temperature within said plurality of thermal management units.

* * * * *